US012556106B2

(12) United States Patent
Ishikawa

(10) Patent No.: US 12,556,106 B2
(45) Date of Patent: Feb. 17, 2026

(54) ELECTRIC POWER CONVERSION DEVICE

(71) Applicant: HITACHI ASTEMO, LTD., Hitachinaka (JP)

(72) Inventor: Shoho Ishikawa, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 276 days.

(21) Appl. No.: 18/563,017

(22) PCT Filed: Aug. 31, 2021

(86) PCT No.: PCT/JP2021/032025
§ 371 (c)(1),
(2) Date: Nov. 21, 2023

(87) PCT Pub. No.: WO2023/032060
PCT Pub. Date: Mar. 9, 2023

(65) Prior Publication Data
US 2024/0266967 A1 Aug. 8, 2024

(51) Int. Cl.
*H02M 7/00* (2006.01)
*H05K 7/14* (2006.01)
(Continued)

(52) U.S. Cl.
CPC ........ *H02M 7/003* (2013.01); *H05K 7/14329* (2022.08); *H05K 7/209* (2013.01);
(Continued)

(58) Field of Classification Search
CPC ...... H02M 1/007; H02M 3/003; H02M 3/155; H02M 7/003; H02M 7/5387;
(Continued)

(56) References Cited

U.S. PATENT DOCUMENTS

2010/0259898 A1* 10/2010 Kimura .............. H05K 7/20927
361/704
2011/0235276 A1* 9/2011 Hentschel .......... H05K 7/14329
361/699

(Continued)

FOREIGN PATENT DOCUMENTS

JP 2014-176237 A 9/2014
JP 2015-053776 A 3/2015
WO WO-2015/159621 A1 10/2015

OTHER PUBLICATIONS

International Search Report with English Translation and Written Opinion dated Nov. 2, 2021 in corresponding International Patent Application No. PCT/JP2021/032025 (8 pages).

*Primary Examiner* — Fred E Finch, III
(74) *Attorney, Agent, or Firm* — Foley & Lardner LLP

(57) ABSTRACT

An electric power conversion device including: a voltage conversion circuit that converts a DC voltage; an inverter circuit that converts the DC voltage into an AC voltage; a negative electrode bus bar commonly connected to the voltage conversion circuit and the inverter circuit; a first positive electrode bus bar connected to the voltage conversion circuit; a second positive electrode bus bar connected d to the inverter circuit; a housing that accommodates the voltage conversion circuit and the inverter circuit; and a first heat dissipation member provided in the housing, in which the first positive electrode bus bar, the second positive electrode bus bar, and the negative electrode bus bar are stacked and electrically insulated from each other, the first positive electrode bus bar and the second positive electrode bus bar are opposite to the first heat dissipation member across an insulating member, and at least one of the first positive electrode bus bar and the second positive electrode bus bar is in thermal contact with the first heat dissipation (Continued)

member via the insulating member and the first heat conductive member.

12 Claims, 8 Drawing Sheets

(51) Int. Cl.
*H05K 7/20* (2006.01)
*H02M 1/00* (2006.01)
*H02M 3/155* (2006.01)
*H02M 7/5387* (2007.01)

(52) U.S. Cl.
CPC ............ *H02M 1/007* (2021.05); *H02M 3/155* (2013.01); *H02M 7/5387* (2013.01)

(58) Field of Classification Search
CPC .. H05K 7/1432; H05K 7/14329; H05K 7/209; H05K 7/20909
See application file for complete search history.

(56) References Cited

U.S. PATENT DOCUMENTS

| | | | |
|---|---|---|---|
| 2016/0020707 A1 | 1/2016 | Fukumasu et al. | |
| 2018/0358903 A1* | 12/2018 | Takahashi | H05K 7/2089 |
| 2022/0166311 A1* | 5/2022 | Kiuchi | H05K 5/0217 |

* cited by examiner

ELECTRIC POWER CONVERSION DEVICE

TECHNICAL FIELD

The present invention relates to an electric power conversion device.

BACKGROUND ART

In an electric power conversion device including a voltage conversion circuit that converts a DC voltage and an inverter circuit that converts the converted DC voltage into an AC voltage, bus bars that form wirings of a positive electrode and a negative electrode are routed. Since a large current flows through the bus bars, the amount of heat generation is large, and a capacitor or the like installed in the electric power conversion device for the purpose of removing noise or the like is greatly affected by heat from the bus bars. Therefore, it is necessary to limit the amount of the current flowing through the bus bars within a range not exceeding a heat-resistant temperature of the capacitor or the like, which is a constraint on output performance of the electric power conversion device.

PTL 1 discloses an electric power conversion device including an inverter circuit unit that converts direct current power into alternating current power; a converter circuit unit that increases a voltage from an external battery and outputs the voltage to the inverter circuit unit; and a smoothing capacitor package. The capacitor package includes: a capacitor element; a negative electrode bus bar connected to both negative electrode sides of the inverter circuit unit and the converter circuit unit; a first positive electrode bus bar connected to a positive electrode of the inverter circuit unit; and a second positive electrode bus bar connected to a positive electrode on a battery side of the converter circuit unit. The first positive electrode bus bar is opposite to one principal face of the negative electrode bus bar, and the second positive electrode bus bar is disposed at a position opposite to the other principal face of the negative electrode bus bar.

CITATION LIST

Patent Literature

PTL 1: JP 2014-176237 A

SUMMARY OF INVENTION

Technical Problem

In the electric power conversion device described in PTL 1, it is difficult to reduce heat of the bus bars, and the output performance of the electric power conversion device is limited.

Solution to Problem

An electric power conversion device according to the present invention includes: a voltage conversion circuit that converts a first DC voltage into a second DC voltage; an inverter circuit that converts the second DC voltage into an AC voltage; a negative electrode bus bar commonly connected to the voltage conversion circuit and the inverter circuit; a first positive electrode bus bar connected to the voltage conversion circuit; a second positive electrode bus bar connected to the inverter circuit; a housing that accommodates the voltage conversion circuit and the inverter circuit; and a first heat dissipation member provided in the housing. The first positive electrode bus bar, the second positive electrode bus bar, and the negative electrode bus bar are stacked and electrically insulated from each other. The first positive electrode bus bar and the second positive electrode bus bar are opposite to the first heat dissipation member across an insulating member. At least one of the first positive electrode bus bar and the second positive electrode bus bar is in thermal contact with the first heat dissipation member via the insulating member and the first heat conductive member.

Advantageous Effects of Invention

According to the present invention, it is possible to reduce heat of the bus bars and improve output performance of the electric power conversion device.

DESCRIPTION OF EMBODIMENTS

Figure 1:
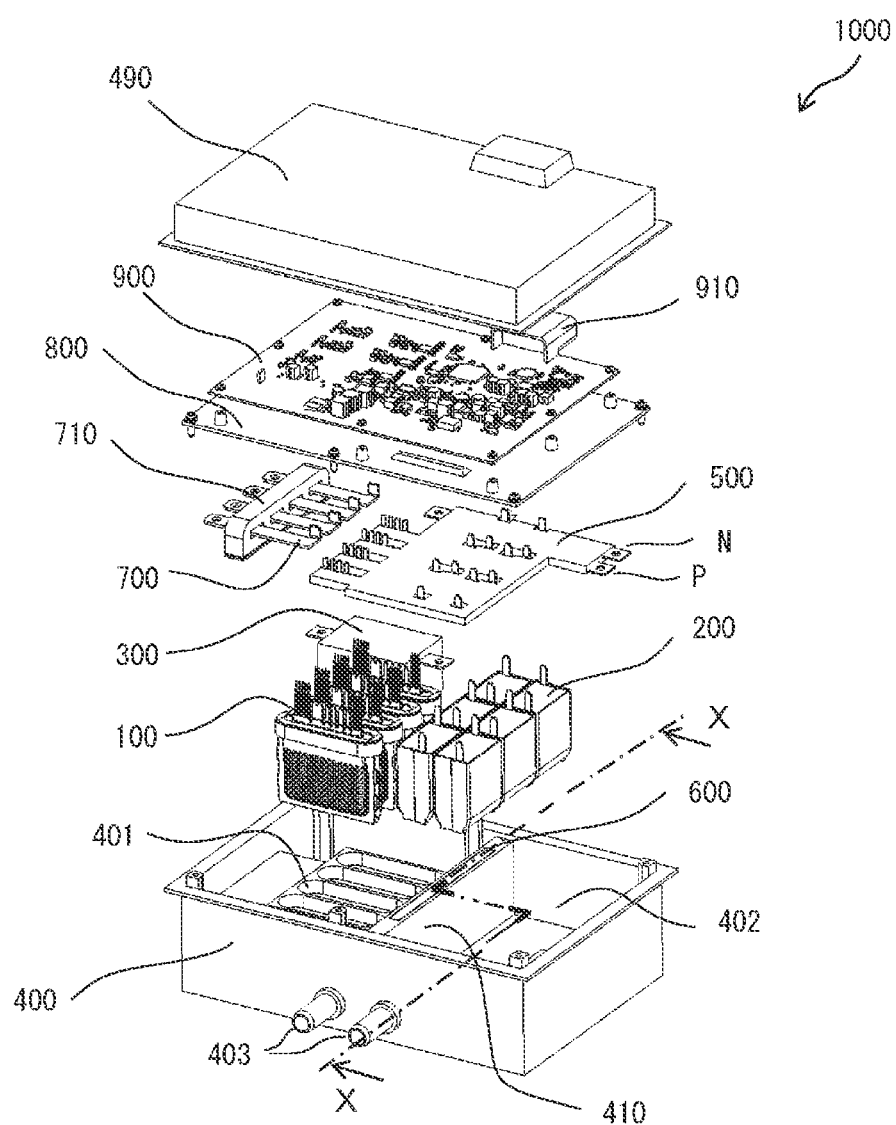
FIG. 1 is an exploded perspective view of an electric power conversion device.

Hereinafter, embodiments of the present invention will be described with reference to the drawings. The following description and drawings are examples given to describe the present invention, and are appropriately omitted and simplified for clarification of the description. The present invention can be implemented in various other forms. Each constituent element may be singular or plural unless specifically limited.

Positions, sizes, shapes, ranges, and the like of the respective constituent elements illustrated in the drawings do not always indicate actual positions, sizes, shapes, ranges and the like in order to facilitate understanding of the invention. Therefore, the present invention is not necessarily limited to the positions, sizes, shapes, ranges, and the like disclosed in the drawings.

When there is a plurality of constituent elements having the same or similar functions, the same reference sign will be sometimes described with different subscripts. When it is unnecessary to distinguish between the plurality of constituent elements, however, the subscripts will be sometimes omitted in the description.

FIG. 1 is an exploded perspective view of an electric power conversion device 1000 according to the present embodiment. The electric power conversion device 1000 includes a semiconductor module 100, a capacitor 200, and a reactor 300. The semiconductor module 100, the capacitor 200, and the reactor 300 are accommodated in a housing 400. The housing 400 is partitioned into a first accommodation space 401 and a second accommodation space 402 by a first heat dissipation member 410 formed integrally with the housing 400. The semiconductor module 100 and the reactor 300 are accommodated in the first accommodation space 401, and the capacitor 200 is accommodated in the second accommodation space 402. A cooling channel through which a refrigerant flows in and out through an inlet/outlet 403 is formed in the housing 400. Although not illustrated, the refrigerant flows through a cooling channel provided in the semiconductor module 100 via the cooling channel in the housing 400. The refrigerant flowing through the cooling channel cools not only the semiconductor module 100 but also the housing 400 and the first heat dissipation member 410.

A mold bus bar 500 is disposed on upper surfaces of the semiconductor module 100 and the reactor 300 accommodated in the first accommodation space 401 and the capacitor 200 accommodated in the second accommodation space 402 to be opposite to bottom surfaces of the first accommodation space 401 and the second accommodation space 402. The mold bus bar 500 is formed by sealing a first positive electrode bus bar 510, a second positive electrode bus bar 520, and a negative electrode bus bar 530 with an insulating resin or the like for the purpose of electrically insulating the respective bus bars and other conductive components from each other. The first positive electrode bus bar 510, the second positive electrode bus bar 520, and the negative electrode bus bar 530 are, for example, flat plate-like wiring members which are made of a conductive material such as copper and form a power wiring. A first heat conductive member 600 is applied on an upper surface of the first heat dissipation member 410, and the mold bus bar 500 is in thermal contact with the first heat dissipation member 410 via the first heat conductive member 600.

The first positive electrode bus bar 510 and the negative electrode bus bar 530 of the mold bus bar 500 are connected to a battery (not illustrated) via terminals P, N, and a DC voltage is supplied from the battery. Four semiconductor modules 100 are provided side by side such that one is used for a voltage conversion circuit 1100, and the other three are used for an inverter circuit 1200 (see FIG. 2).

The semiconductor module 100 for the voltage conversion circuit 1100 steps up the DC voltage supplied via the mold bus bar 500 and converts the DC voltage into a DC voltage by a switching operation of semiconductor elements sealed in the semiconductor module 100. The converted DC voltage is output to one of output bus bars 700, and is input to semiconductor module 100 used as the inverter circuit 1200 via the mold bus bar 500.

The semiconductor module 100 for the inverter circuit 1200 converts the DC voltage supplied from the voltage conversion circuit 1100 via the mold bus bar 500 into an AC current by a switching operation of semiconductor elements sealed in the semiconductor module 100. The converted AC current is output from the output bus bar 700. The output AC current is supplied to a motor (not illustrated) to drive the motor. A current sensor 710 is disposed near the output bus bars 700.

The first accommodation space 401 and the second accommodation space 402 are closed by a base plate 800. Peripheries such as four corners of the base plate 800 are fixed to the housing 400 with screws or the like. A circuit board 900 is installed on the base plate 800. A control circuit 1300 that drives and controls the voltage conversion circuit 1100 and the inverter circuit 1200 is mounted on the circuit board 900 (see FIG. 2). The semiconductor module 100 has a control terminal to which a drive signal G2 from the control circuit 1300 is input, and a connection line with the control terminal is connected to the control circuit 1300 on the circuit board 900 via a hole provided in the base plate 800. In addition, electronic components receives and outputs a command signal such as a torque command from and to an external control device via a connector 910.

The housing 400 includes a cover 490 and accommodates the base plate 800 and the circuit board 900. A seal ring or a liquid seal is provided between the housing 400 and the cover 490 to ensure internal airtightness of the electric power conversion device 1000. The housing 400, the first heat dissipation member 410, the cover 490, and the base plate 800 are made of a material having high thermal conductivity such as aluminum.

Figure 2:
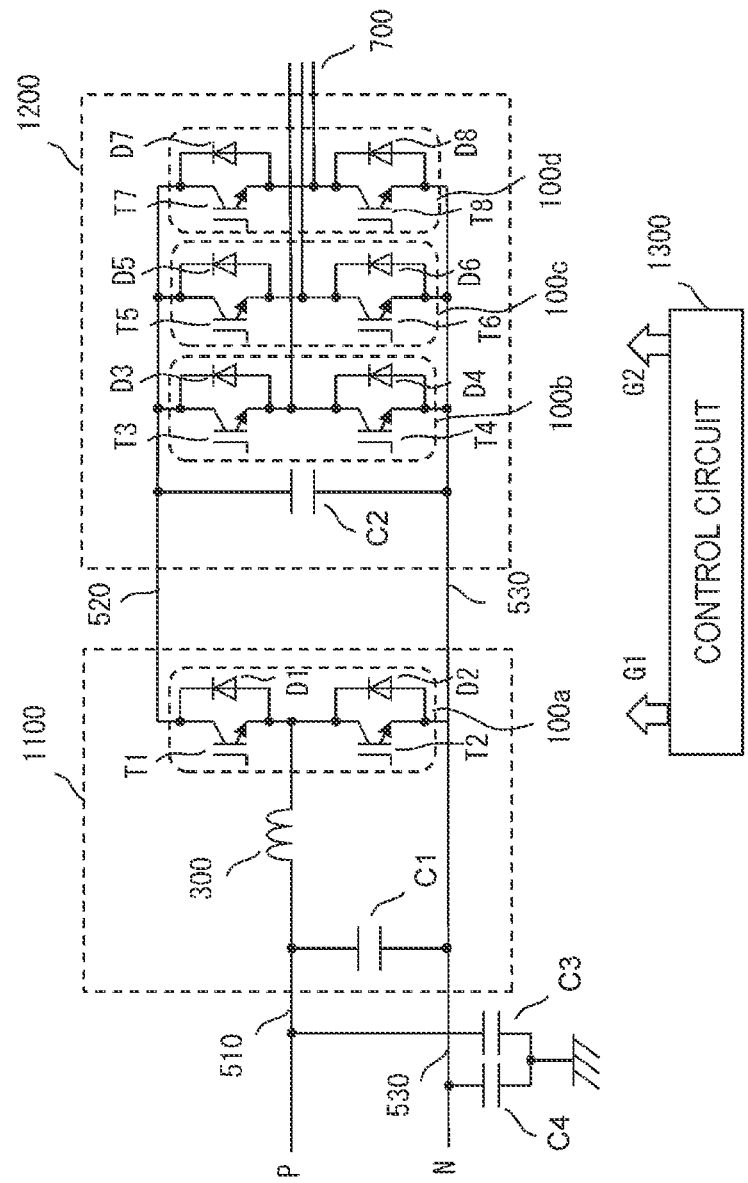
FIG. 2 is a circuit configuration diagram of the electric power conversion device.

FIG. 2 is a circuit configuration diagram of the electric power conversion device 1000.

The electric power conversion device 1000 includes the voltage conversion circuit 1100, the inverter circuit 1200, and the control circuit 1300. The voltage conversion circuit 1100 and the inverter circuit 1200 include semiconductor modules 100*a*, 100*b*, 100*c*, and 100*d* incorporating the semiconductor elements. In the semiconductor modules 100*a*, 100*b*, 100*c*, and 100*d*, ON and OFF of the semiconductor elements are switched by drive signals G1 and G2 from the control circuit 1300 on the circuit board 900. The control circuit 1300 controls the switching operation of the semiconductor modules 100*a*, 100*b*, 100*c*, and 100*d* on the basis of the command signal from the external control device (not illustrated).

The DC voltage is input from the battery between the first positive electrode bus bar 510 and the negative electrode bus bar 530 to the voltage conversion circuit 1100 via the terminals P and N. Capacitors C3 and C4 for filtering are provided between the first positive electrode bus bar 510 and a ground and between the negative electrode bus bar 530 and the ground. The capacitors C3 and C4 are mounted to reduce common mode noise flowing through a positive electrode and a negative electrode. Specifically, noise from the voltage conversion circuit 1100 and the inverter circuit 1200 is bypassed to the ground to prevent the common mode noise from being conducted to the battery. Furthermore, common mode noise from the battery is prevented from being conducted to the voltage conversion circuit 1100 and the inverter circuit 1200.

The voltage conversion circuit 1100 includes the semiconductor module 100*a*, the reactor 300, and a capacitor C1. In the semiconductor module 100*a*, semiconductor elements T1 and T2 are connected in series, and diodes D1 and D2 are connected in parallel between collectors and emitters of the semiconductor elements T1 and T2, respectively. The second positive electrode bus bar 520 is connected to the collector side of the semiconductor element T1, and one end of the reactor 300 and the collector side of the semiconductor element T2 are connected to the emitter side of the semiconductor element T1. In addition, the other end of the reactor 300 is connected to the first positive electrode bus bar 510, and the emitter side of the semiconductor element T2 is connected to the negative electrode bus bar 530. The capacitor C1 is connected between the first positive electrode bus bar 510 at the other end of the reactor 300 and the negative electrode bus bar 530. The negative electrode bus bar 530 is commonly connected to the voltage conversion circuit 1100 and the inverter circuit 1200.

In the voltage conversion circuit 1100, ON and OFF of the semiconductor elements T1 and T2 are controlled by the drive signal G1 from the control circuit 1300. As a result, the voltage conversion circuit 1100 performs a step-up function of converting the DC voltage from the battery into a higher DC voltage value and outputting the converted DC voltage to the inverter circuit 1200. In addition, a step-down function of converting the DC voltage output from the inverter circuit 1200 to the voltage conversion circuit 1100 into a lower DC voltage and outputting the converted DC voltage to the battery is performed during a regenerative operation of the motor.

The inverter circuit 1200 includes the semiconductor modules 100b, 100c, and 100d and a capacitor C2. In the semiconductor module 100b, semiconductor elements T3 and T4 are connected in series, and diodes D3 and D4 are connected in parallel between collectors and emitters of the semiconductor elements T3 and T4, respectively. In the semiconductor module 100c, semiconductor elements T5 and T6 connected in series, and diodes D5 and D6 are connected in parallel between collectors and emitters of the semiconductor elements T5 and T6, respectively. In the semiconductor module 100d, semiconductor elements T7 and T8 are connected in series, and diodes D7 and D8 are connected in parallel between collectors and emitters of the semiconductor elements T7 and T8, respectively.

The collector side of each of the semiconductor elements T3, T5, and T7 is connected to the second positive electrode bus bar 520, and the emitter side of each of the semiconductor elements T4, T6, and T8 is connected to the negative electrode bus bar 530. The capacitor C2 for smoothing is connected between the second positive electrode bus bar 520 and the negative electrode bus bar 530. A connection point between the emitter side of each of the semiconductor elements T3, T5, and T7 and the collector side of each of the semiconductor elements T4, T6, and T8 is connected to a motor (not illustrated) via the output bus bar 700.

In the inverter circuit 1200, ON and OFF of the semiconductor elements T3 to T8 are controlled by the drive signal G2 from the control circuit 1300 on the basis of the DC voltage output from the voltage conversion circuit 1100. As a result, three-phase AC power is output to the motor by varying a phase of an AC current flowing through the motor by 120° for each of U, V, and W phases, thereby driving the motor.

Figure 3:
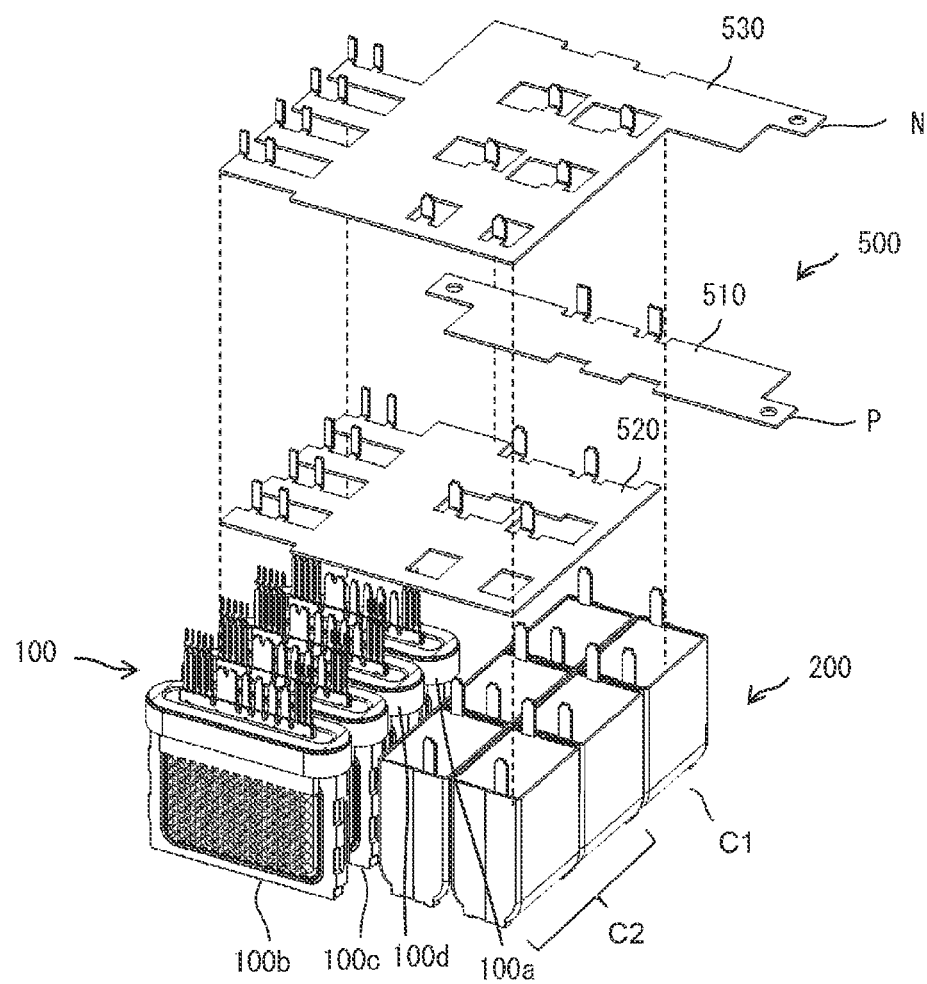
FIG. 3 is an exploded perspective view of a main part of the electric power conversion device.

FIG. 3 is an exploded perspective view of a main part of the electric power conversion device 1000. The semiconductor modules 100, the capacitor 200, and the mold bus bar 500 are illustrated. The mold bus bar 500 is illustrated in a state where sealing of the insulating resin is removed. The capacitor 200 may include the capacitors C1, C2, C3, and C4 although an example of including the capacitors C1 and C2 is illustrated. The reactor 300 is not illustrated.

The mold bus bar 500 includes the first positive electrode bus bar 510, the second positive electrode bus bar 520, and the negative electrode bus bar 530. The first positive electrode bus bar 510, the second positive electrode bus bar 520, and the negative electrode bus bar 530 are the wiring members each of which is formed in a flat plate shape using the conductive material such as copper. The first positive electrode bus bar 510 and the second positive electrode bus bar 520 are disposed in parallel on the upper surfaces of the semiconductor modules 100a, 100b, 100c, and 100d and the capacitor 200. The first positive electrode bus bar 510 is disposed on the upper surfaces of the semiconductor module 100a and the capacitor C1 in a state of being insulated from each other, and the second positive electrode bus bar 520 is disposed on the upper surfaces of the semiconductor modules 100b, 100c, and 100d and the capacitor C2 in a state of being insulated from each other. The negative electrode bus bar 530 is provided to be stacked on the first positive electrode bus bar 510 and the second positive electrode bus bar 520 on the opposite side of the semiconductor module 100 and the capacitor 200 across the first positive electrode bus bar 510 and the second positive electrode bus bar 520.

The first positive electrode bus bar 510 is connected to an emitter terminal, which protrudes from the semiconductor module 100a, of the semiconductor element T1 via the reactor 300. The negative electrode bus bar 530 is connected to an emitter terminal of the semiconductor element T2 protruding from the semiconductor module 100a.

Collector terminals of the semiconductor elements T3, T5, and T7 protruding from the semiconductor modules 100b, 100c, and 100d are connected to the second positive electrode bus bar 520. Emitter terminals of the semiconductor elements T4, T6, and T8 protruding from the semiconductor modules 100b, 100c, and 100d are connected to the negative electrode bus bar 530.

A positive electrode terminal and a negative electrode terminal of the capacitor C1 are connected to the first positive electrode bus bar 510 and the negative electrode bus bar 530, respectively, and a positive electrode terminal and a negative electrode terminal of the capacitor C2 are connected to the second positive electrode bus bar 520 and the negative electrode bus bar 530, respectively.

Note that the control terminals protrude from the gates of the semiconductor elements T1 to T8 of the semiconductor modules 100 and are connected to the control circuit 1300 on the circuit board 900 although not illustrated. In addition, an output terminal protrudes from the connection point between the emitter side of each of the semiconductor elements T3, T5, and T7 and the collector side of each of the semiconductor elements T4, T6, and T8 in the semiconductor modules 100, and is connected to the output bus bar 700.

For example, in a case where the motor is used as a drive source of a vehicle, the electric power conversion device 1000 uses the voltage conversion circuit 1100 and the inverter circuit 1200 as described with reference to FIG. 2. In this case, the positive electrode bus bar is divided into the first positive electrode bus bar 510 and the second positive electrode bus bar 520. As a result, as illustrated in FIG. 3, areas of the first positive electrode bus bar 510, the second positive electrode bus bar 520, and the negative electrode bus bar 530 formed in the flat plate shape are different from each other, and the area increases in the order of the first positive electrode bus bar 510, the second positive electrode bus bar 520, and the negative electrode bus bar 530. Assuming that the respective bus bars have the same thickness, an electric resistance value increases as the area decreases. Therefore, when the respective bus bars are energized, the amount of heat generation increases in the order of the larger electric resistance value, that is, in the order of the first positive electrode bus bar 510, the second positive electrode bus bar 520, and the negative electrode bus bar 530. In the present embodiment, each of the bus bars is disposed according to the amount of heat generation of the bus bar to reduce heat of the bus bars overall as will be described below.

In addition, the capacitor 200 is electrically connected to the electric power conversion device 1000 for the purpose of supplying charge to the semiconductor elements, removing noise, and the like. The capacitor 200 is affected by the heat from the bus bars. In general, a capacitor element in the capacitor 200 has a low heat-resistant temperature, and thus, it is necessary to limit the amount of the current flowing through the bus bars within a range not exceeding the heat-resistant temperature of the capacitor element, which is a constraint on output performance of the electric power conversion device 1000. In the present embodiment, the amount of the current flowing through the bus bars can be increased by reducing the heat of the bus bars, whereby the output performance of the electric power conversion device 1000 is improved.

Figure 4:
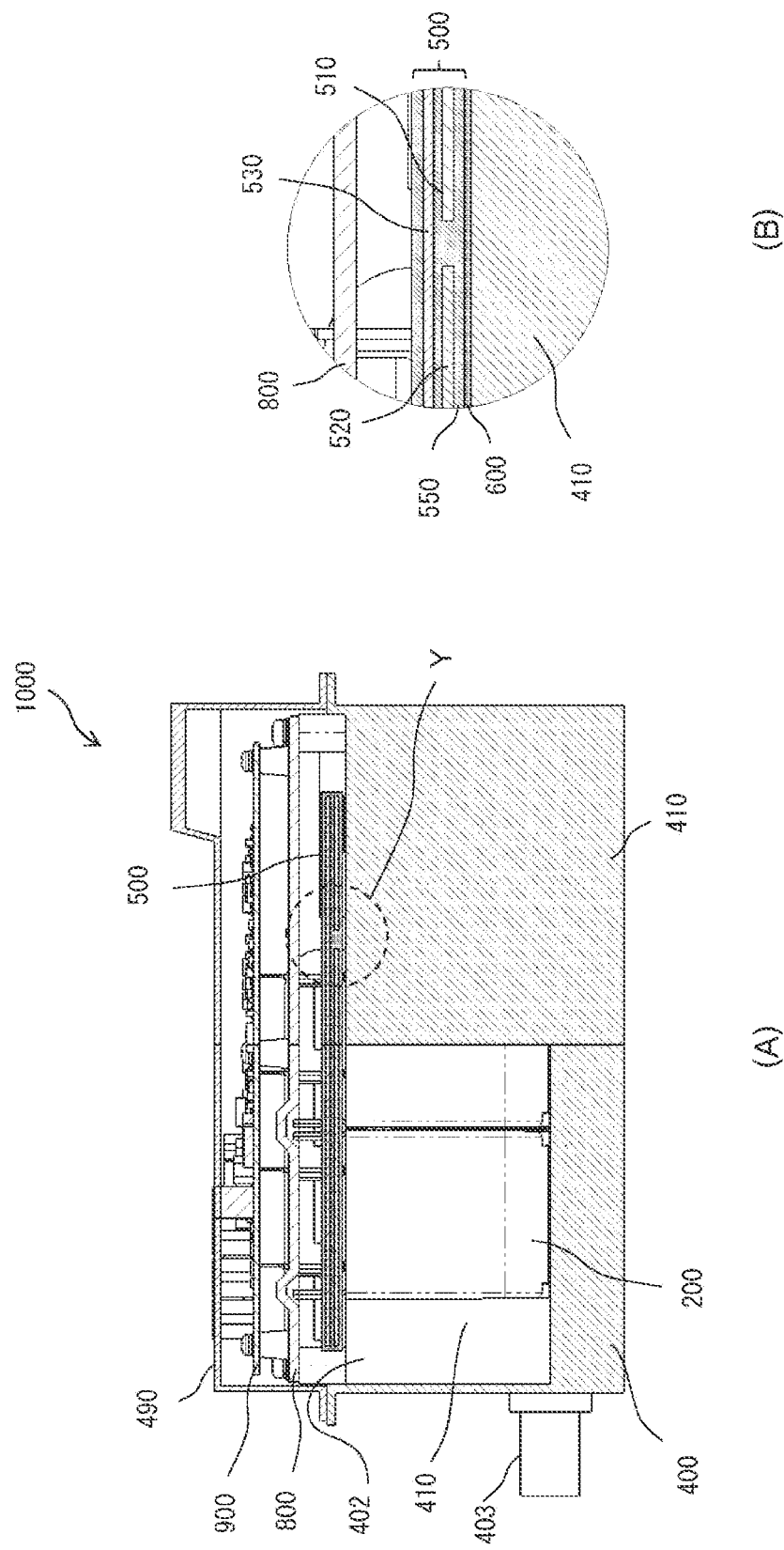
FIGS. 4(A) and 4(B) are cross-sectional views of the electric power conversion device.

FIGS. 4(A) and 4(B) are cross-sectional views of the electric power conversion device 1000. FIG. 4(A) is a cross-sectional view taken along a line X-X after the electric power conversion device 1000 illustrated in FIG. 1 is assembled, and FIG. 4(B) is an enlarged cross-sectional view of a part Y in FIG. 4(A). The same portions as those in FIGS. 1 to 3 are denoted by the same reference signs, and the description thereof will be simplified.

As illustrated in FIG. 4(A), the housing 400 includes the cover 490, and accommodates the circuit board 900, the base plate 800, the mold bus bar 500, the capacitor 200, and the like. The housing 400 includes the first heat dissipation member 410 formed integrally with the housing 400.

As illustrated in FIG. 4(B), in the mold bus bar 500, the first positive electrode bus bar 510, the second positive electrode bus bar 520, and the negative electrode bus bar 530 are electrically insulated from each other and stacked. Then, the first positive electrode bus bar 510 and the second positive electrode bus bar 520 are disposed so as to be opposite to the first heat dissipation member 410 across the insulating member 550. As a result, the first positive electrode bus bar 510 and the second positive electrode bus bar 520 are in thermal contact with the first heat dissipation member 410 via the insulating member 550 and the first heat conductive member 600. The first heat conductive member 600 is made of, for example, a thermally conductive material such as grease or a sheet, and transfers heat from a high-temperature member to a low-temperature member, thereby serving as a cooling path for the high-temperature member. Note that at least one of the first positive electrode bus bar 510 and the second positive electrode bus bar 520 may be configured to be in thermal contact with the first heat dissipation member 410 via the insulating member 550 and the first heat conductive member 600. More preferably, at least the first heat dissipation member 410 having a large amount of heat generation is configured to be in thermal contact with the first heat dissipation member 410.

In addition, the insulating member 550 is a member that is formed using an insulating resin, an insulating paper, or the like and electrically insulates different potentials from each other, but may be formed using a part of the mold bus bar 500 that seals the first positive electrode bus bar 510, the second positive electrode bus bar 520, and the negative electrode bus bar 530 as illustrated in this example. As another example, surfaces of the first positive electrode bus bar 510 and the second positive electrode bus bar 520 opposite to the first heat dissipation member 410 may be exposed, and the insulating member 550 may be disposed on the exposed surfaces.

According to the present embodiment, the first positive electrode bus bar 510 and the second positive electrode bus bar 520 with a larger amount of heat generation than the negative electrode bus bar 530 are disposed on the side opposite to the first heat dissipation member 410, so that the heat of the entire mold bus bar 500 can be reduced. Therefore, the amount of the current flowing through the bus bars can be increased, so that the output performance of the electric power conversion device 1000 can be improved.

In addition, the housing 400 is partitioned into the first accommodation space 401 and the second accommodation space 402 by the first heat dissipation member 410, the semiconductor module 100 is accommodated in the first accommodation space 401, and the capacitor 200 is accommodated in the second accommodation space 402. As a result, it is possible to suppress conduction of the heat of the semiconductor module 100 to the capacitor 200.

Figure 5:
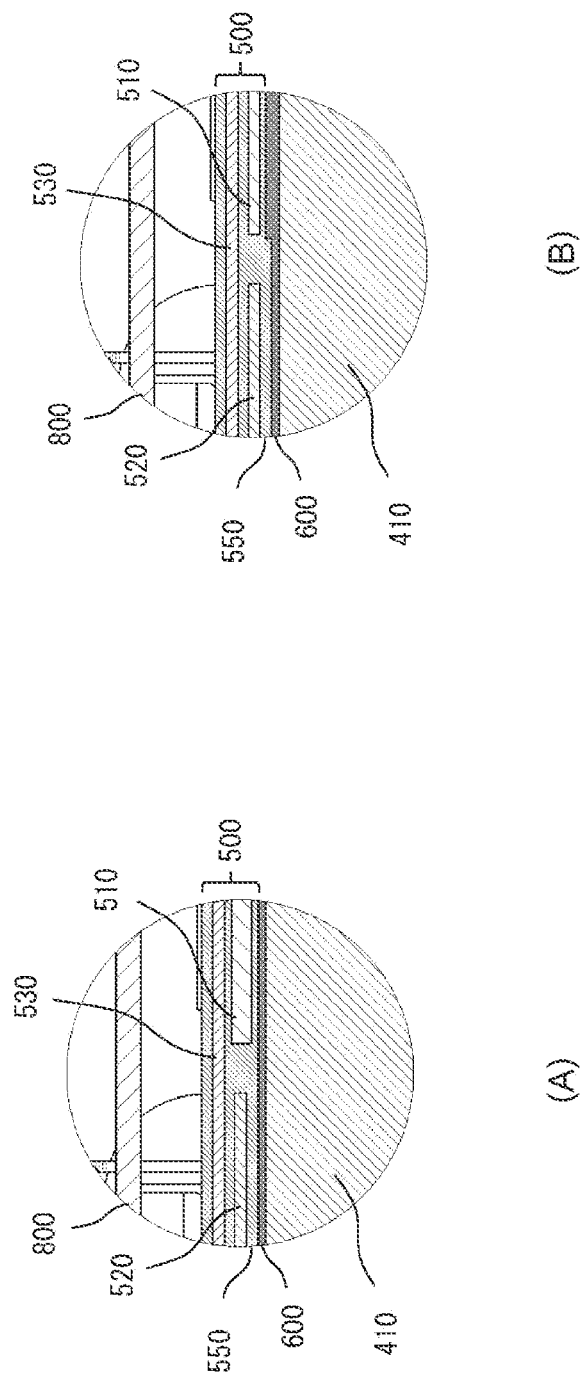
FIGS. 5(A) and 5(B) are cross-sectional views illustrating first and second modifications of the electric power conversion device.

FIGS. 5(A) and 5(B) are cross-sectional views illustrating modifications of the electric power conversion device 1000. The both correspond to enlarged cross-sectional views of the part Y in FIG. 4(A), FIG. 5(A) illustrates a first modification, and FIG. 5(B) illustrates a second modification. The same portions as those in FIG. 4(B) are denoted by the same reference signs, and the description thereof will be simplified.

In the first modification illustrated in FIG. 5(A), a thickness of the first positive electrode bus bar 510 is made larger than thicknesses of the second positive electrode bus bar 520 and the negative electrode bus bar 530. The thickness of the first positive electrode bus bar 510 is made larger to reduce the electric resistance of the first positive electrode bus bar 510, thereby suppressing the amount of heat generation at the time of energization. Since the current with which the bus bars are energized can be increased as the amount of heat generation of the bus bars is suppressed, the output performance of the electric power conversion device 1000 can be enhanced. Note that the thickness of the first positive electrode bus bar 510 may be larger than at least one of the second positive electrode bus bar 520 and the negative electrode bus bar 530.

In the second modification illustrated in FIG. 5(B), a thickness of the insulating member 550 is made smaller in a region where the first positive electrode bus bar 510 is opposite to the first heat dissipation member 410 than in the other regions. Although the first heat conductive member 600 becomes thicker as the insulating member 550 is made smaller, the first heat conductive member 600 has a higher coefficient of thermal conductivity than the insulating member 550. Therefore, since the thickness of insulating member 550 is made thin in the region opposite to the first positive electrode bus bar 510, the heat dissipation efficiency of the first positive electrode bus bar 510 increases, and the temperature of the first positive electrode bus bar 510 can be lowered.

Figure 6:
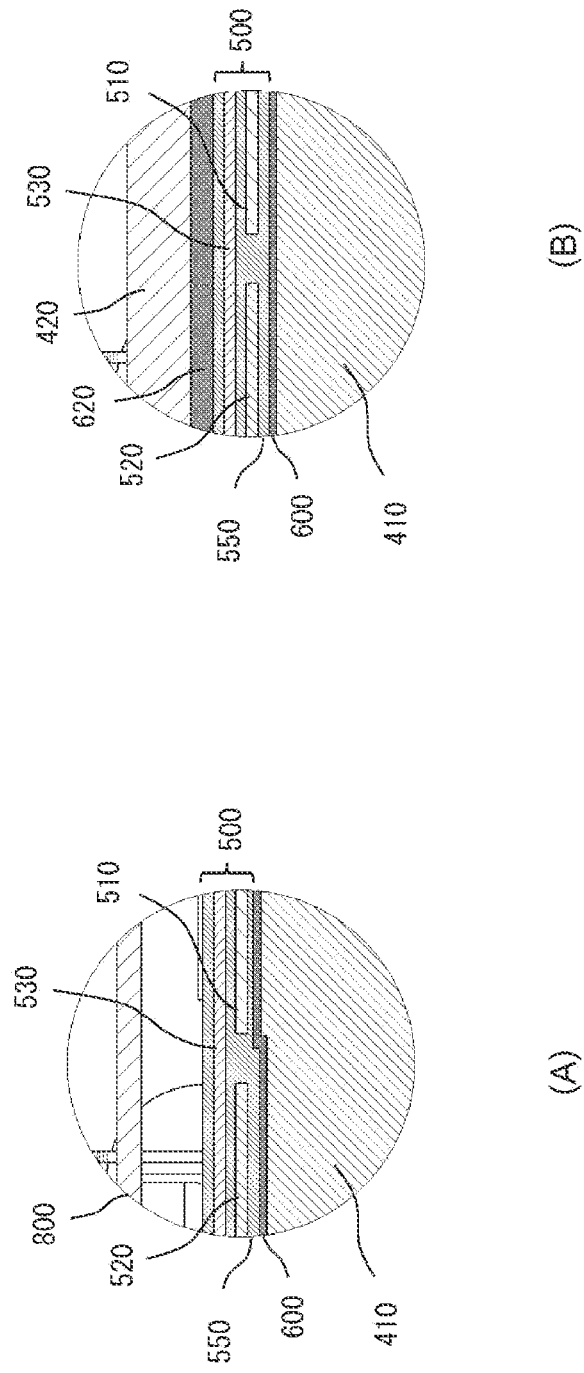
FIGS. 6(A) and 6(B) are cross-sectional views illustrating third and fourth modifications of the electric power conversion device.

FIGS. 6(A) and 6(B) are cross-sectional views e illustrating modifications of the electric power conversion device 1000. The both correspond to enlarged cross-sectional views of the part Y in FIG. 4(A), FIG. 6(A) illustrates a third modification, and FIG. 6(B) illustrates a fourth modification. The same portions as those in FIG. 4(B) are denoted by the same reference signs, and the description thereof will be simplified.

In the third modification illustrated in FIG. 6(A), a distance between the first heat dissipation member 410 and the first positive electrode bus bar 510 is shorter in a region where the first positive electrode bus bar 510 is opposite to the first heat dissipation member 410 than in the other regions. Since a heat dissipation path from the first positive electrode bus bar 510 to the first heat dissipation member 410 is made shorter, the cooling efficiency of the first positive electrode bus bar 510 increases, and the temperature of first positive electrode bus bar 510 can be lowered.

In the fourth modification illustrated in FIG. 6(B), the second heat dissipation member 420 is provided on the opposite side of the first heat dissipation member 410 across the negative electrode bus bar 530, the first positive electrode bus bar 510, and the second positive electrode bus bar 520. The second heat dissipation member 420 is in thermal contact with the negative electrode bus bar 530 via the second heat conductive member 620. The second heat conductive member 620 is made of, for example, a thermally conductive material such as grease or a sheet, and transfers heat from a high-temperature member to a low-temperature member, thereby serving as a cooling path for the high-temperature member. The second heat dissipation member 420 may be the base plate 800, or may be another member having high thermal conductivity in contact with the base plate 800 or the housing 400. A thickness of the first heat conductive member 600 is smaller than that of the second heat conductive member 620. Since the heat dissipation members 410 and 420 are disposed on both surfaces of the mold bus bar 500, the temperature of the bus bar can be lowered. Since the thickness of the first heat conductive member 600 is made smaller than that of the second heat conductive member 620, the cooling efficiency of the first positive electrode bus bar 510 having a large amount of heat generation increases, and the temperature of the first positive electrode bus bar 510 can be lowered.

Figure 7:
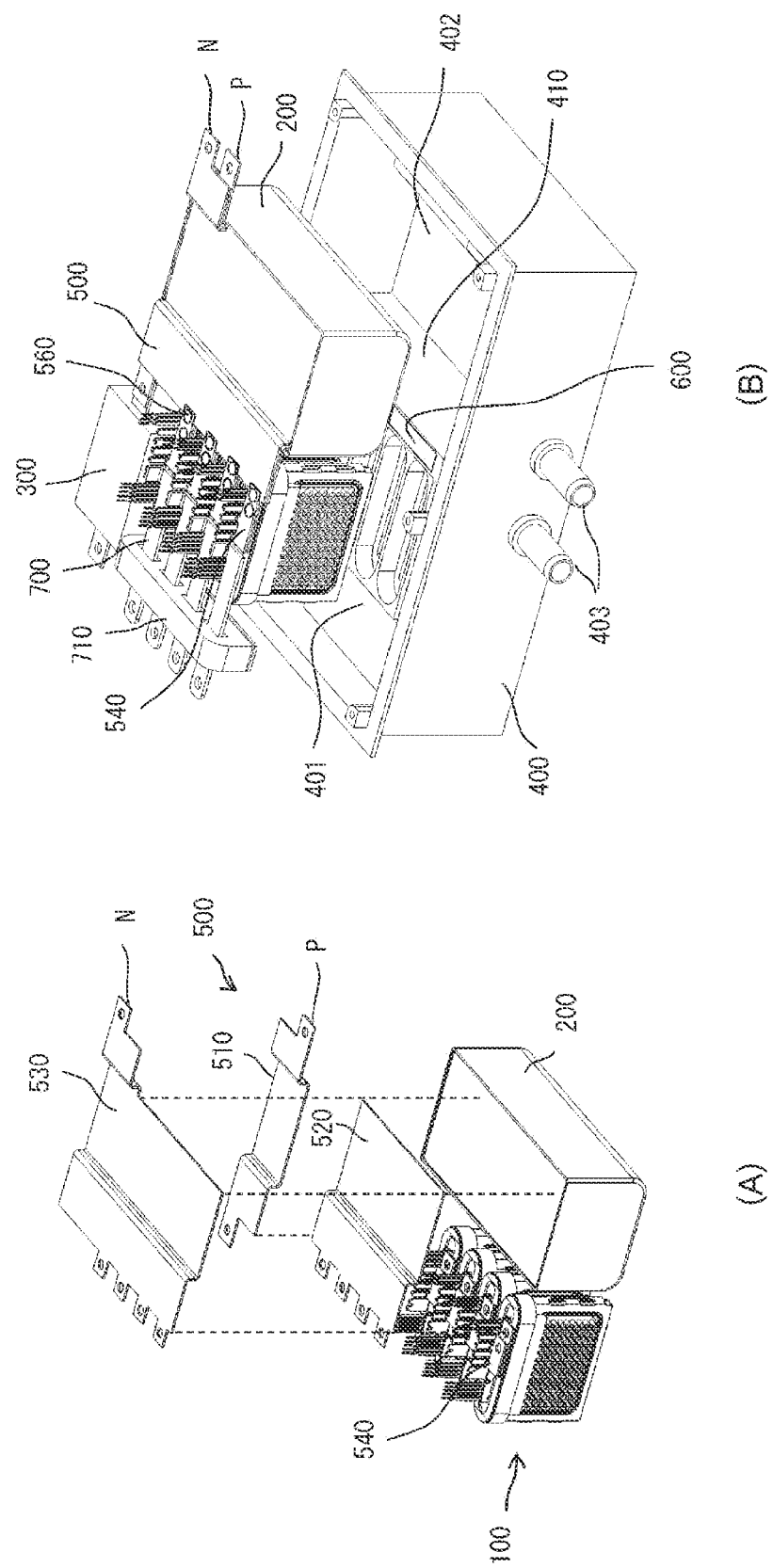
FIG. 7 is a perspective view illustrating a fifth modification of the electric power conversion device.

FIGS. 7(A) and 7(B) are perspective views illustrating a fifth modification of the electric power conversion device 1000. FIG. 7(A) is an exploded perspective view, and FIG. 7(B) is a perspective view before being assembled into the housing 400. A difference from the example illustrated in FIG. 3 is that the mold bus bar 500 and the capacitor 200 are integrally configured. The same portions as those in FIGS. 1 and 3 are denoted by the same reference signs, and the description thereof will be simplified.

FIG. 7(A) is the exploded perspective view in which an upper surface of the capacitor 200 has an integral structure with the mold bus bar 500. Although not illustrated, the first positive electrode bus bar 510, the second positive electrode bus bar 520, and the negative electrode bus bar 530 of mold bus bar 500 are connected to the positive electrode terminal and the negative electrode terminal of the capacitor 200 by bolts or welding to form the integral structure with the mold bus bar 500. In addition, the mold bus bar 500 and the semiconductor module 100 are connected via a relay bus bar 540.

As illustrated in FIG. 7(B), the mold bus bar 500 and the capacitor 200 have the integral structure. The relay bus bar 540 has a stacked structure of two layers in a state of being insulated from each other in accordance with a stacked structure of two layers of the first positive electrode bus bar 510 and the second positive electrode bus bar 520, and the negative electrode bus bar 530. Then, one end of the relay bus bar 540 in the first layer is fastened to the first positive electrode bus bar 510 and the second positive electrode bus bar 520 by a bolt 560. One end of the relay bus bar 540 in the second layer and the negative electrode bus bar 530 are fastened by a bolt 560. The other end of the relay bus bar 540 in the first layer is connected to a positive electrode side of the semiconductor module 100, and the other end of the relay bus bar 540 in the second layer is connected to a negative electrode side of the semiconductor module 100. An output terminal of the semiconductor module 100 is connected to the output bus bar 700.

Figure 8:
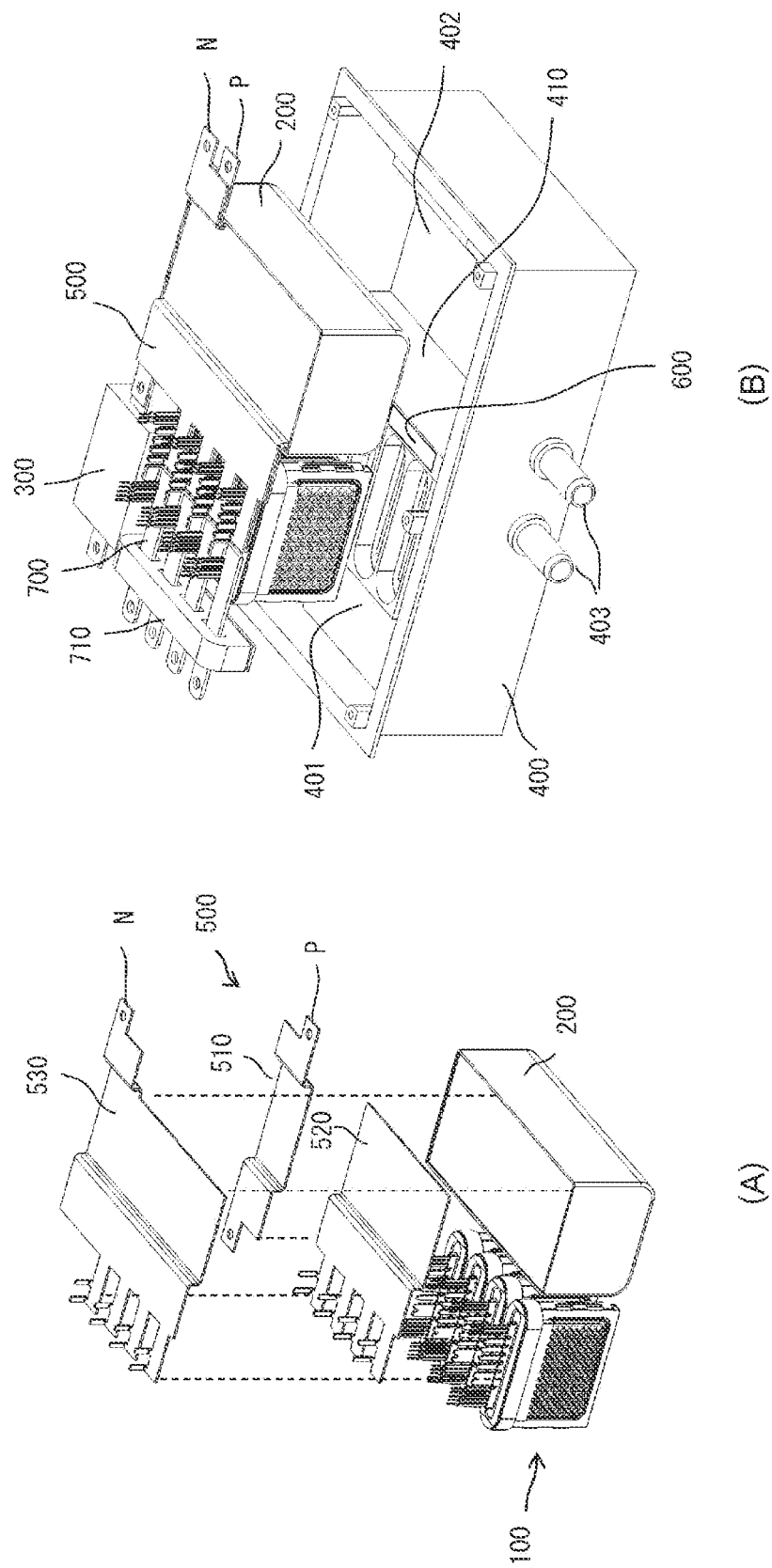
FIG. 8 is a perspective view illustrating a sixth modification of the electric power conversion device.

FIGS. 8(A) and 8(B) are perspective views illustrating a sixth modification of the electric power conversion device 1000. FIG. 8(A) is an exploded perspective view, and FIG. 8(B) is a perspective view before being assembled into the housing 400. This is an example in which the mold bus bar 500 and the capacitor 200 are integrally configured similarly to the examples illustrated in FIGS. 7(A) and 7(B), but a difference is that the relay bus bar 540 is not used. The same portions as those in FIGS. 1, 3, 7(A), and 7(B) are denoted by the same reference signs, and the description thereof will be simplified.

FIG. 8(A) is the exploded perspective view in which an upper surface of the capacitor 200 has an integral structure with the mold bus bar 500. Although not illustrated, the first positive electrode bus bar 510, the second positive electrode bus bar 520, and the negative electrode bus bar 530 of mold bus bar 500 are connected to the positive electrode terminal and the negative electrode terminal of the capacitor 200 by bolts or welding to form the integral structure with the mold bus bar 500. In addition, the mold bus bar 500 and the semiconductor module 100 are directly connected by the mold bus bar 500.

As illustrated in FIG. 8(B), the mold bus bar 500 and the capacitor 200 have the integral structure. The first positive electrode bus bar 510 and the second positive electrode bus bar 520 are connected to a positive electrode side of the semiconductor module 100, and the negative electrode bus bar 530 is connected to a negative electrode side of the semiconductor module 100. An output terminal of the semiconductor module 100 is connected to the output bus bar 700. Since the relay bus bar 540 is not used, there is no possibility that heat is generated at a connection portion with the relay bus bar 540. In addition, a structure can be simplified, and the number of assembling steps can be reduced.

Also in the fifth modification and the sixth modification, at least one of the first positive electrode bus bar 510 and the second positive electrode bus bar 520 is configured to be in thermal contact with the first heat dissipation member 410 via the insulating member 550 and the first heat conductive member 600. Therefore, even when the mold bus bar 500 and the capacitor 200 have the integral structure, heat of the first positive electrode bus bar 510 and the second positive electrode bus bar 520 that generate a large amount of heat can be reduced overall. Therefore, the amount of the current flowing through the bus bars can be increased, so that the output performance of the electric power conversion device 1000 can be improved.

According to the above-described embodiments, the following operational effects are obtained.

(1) The electric power conversion device 1000 includes: the voltage conversion circuit 1100 that converts a first DC voltage into a second DC voltage; the inverter circuit 1200 that converts the second DC voltage into an AC voltage; the negative electrode bus bar 530 commonly connected to the voltage conversion circuit 1100 and the inverter circuit 1200; the first positive electrode bus bar 510 connected to the voltage conversion circuit 1100; the second positive electrode bus bar 520 connected to the inverter circuit 1200; the housing 400 that accommodates the voltage conversion circuit 1100 and the inverter circuit 1200; and the first heat dissipation member 410 provided in the housing 400. The first positive electrode bus bar 510, the second positive electrode bus bar 520, and the negative electrode bus bar 530 are stacked and electrically insulated from each other. The first positive electrode bus bar 510 and the second positive electrode bus bar 520 are opposite to the first heat dissipation member 410 across the insulating member 550. At least one of the first positive electrode bus bar 510 and the second positive electrode bus bar 520 is in thermal contact with the first heat dissipation member 410 via the insulating member 550 and the first heat conductive member 600. As a result, it is possible to reduce heat of the bus bars and improve output performance of the electric power conversion device.

The present invention is not limited to the above-described embodiments, and other modes, which are conceivable inside a scope of a technical idea of the present invention, are also included in a scope of the present invention as long as characteristics of the present invention are not impaired. In addition, the invention may be configured by combining the embodiments and a plurality of modifications.

REFERENCE SIGNS LIST 100, 100a, 100b, 100c, 100d semiconductor module
200, C1, C2, C3, C4 capacitor
300 reactor
400 housing
401 first accommodation space
402 second accommodation space
403 inlet/outlet
410 first heat dissipation member
420 second heat dissipation member
490 cover
500 mold bus bar
510 first positive electrode bus bar
520 second positive electrode bus bar
530 negative electrode bus bar
540 relay bus bar
550 insulating member
600 first heat conductive member
620 second heat conductive member
700 output bus bar
710 current sensor
800 base plate
900 circuit board
910 connector
1000 electric power conversion device
1100 voltage conversion circuit
1200 inverter circuit
1300 control circuit
T1 to T8 semiconductor element
D1 to D8 diode

The invention claimed is:

1. An electric power conversion device comprising:
a voltage conversion circuit that converts a first DC voltage into a second DC voltage;
an inverter circuit that converts the second DC voltage into an AC voltage;
a negative electrode bus bar commonly connected to the voltage conversion circuit and the inverter circuit;
a first positive electrode bus bar connected to the voltage conversion circuit;
a second positive electrode bus bar connected to the inverter circuit;
a housing that accommodates the voltage conversion circuit and the inverter circuit; and
a first heat dissipation member provided in the housing,
wherein the first positive electrode bus bar, the second positive electrode bus bar, and the negative electrode bus bar are stacked and electrically insulated from each other,
the first positive electrode bus bar and the second positive electrode bus bar are opposite to the first heat dissipation member across an insulating member, and
at least one of the first positive electrode bus bar and the second positive electrode bus bar is in thermal contact with the first heat dissipation member via the insulating member and a first heat conductive member.

2. The electric power conversion device according to claim 1, further comprising:
a semiconductor module that incorporates a semiconductor element and forms the voltage conversion circuit and the inverter circuit, and a capacitor that forms the voltage conversion circuit and the inverter circuit,
wherein the first heat dissipation member partitions an inside of the housing into a first accommodation space in which the semiconductor module is accommodated and a second accommodation space in which the capacitor is accommodated.

3. The electric power conversion device according to claim 2, wherein
the negative electrode bus bar, the first positive electrode bus bar, and the second positive electrode bus bar are opposite to bottom surfaces of the first accommodation space and the second accommodation space, and are disposed on upper surfaces of the semiconductor module accommodated in the first accommodation space and the capacitor accommodated in the second accommodation space.

4. The electric power conversion device according to claim 3, wherein
the negative electrode bus bar is stacked on the first positive electrode bus bar and the second positive electrode bus bar on an opposite side of the semiconductor module and the capacitor across the first positive electrode bus bar and the second positive electrode bus bar.

5. The electric power conversion device according to claim 4, wherein
a second heat dissipation member is disposed on an opposite side of the first heat dissipation member across the negative electrode bus bar, the first positive electrode bus bar, and the second positive electrode bus bar, and
wherein the second heat dissipation member is in thermal contact with the negative electrode bus bar via the second heat conductive member.

6. The electric power conversion device according to claim 5, wherein
a thickness of the first heat conductive member is smaller than a thickness of the second heat conductive member.

7. The electric power conversion device according to claim 2, wherein
the first heat dissipation member is provided integrally with the housing.

8. The electric power conversion device according to claim 7, wherein
a cooling channel is formed in the housing.

9. The electric power conversion device according to claim 2, further comprising
a mold bus bar in which the first positive electrode bus bar, the second positive electrode bus bar, and the negative electrode bus bar are sealed with an insulating resin,
wherein the mold bus bar is configured integrally with the capacitor.

10. The electric power conversion device according to claim 1, wherein
the first positive electrode bus bar has a thickness larger than at least one of the second positive electrode bus bar and the negative electrode bus bar.

11. The electric power conversion device according to claim 1, wherein a thickness of the insulating member is smaller in a region where the first positive electrode bus bar is opposite to the first heat dissipation member than in other regions.

12. The electric power conversion device according to claim 1, wherein
a distance between the first heat dissipation member and the first positive electrode bus bar is shorter in a region where the first positive electrode bus bar is opposite to the first heat dissipation member than in other regions.

* * * * *